United States Patent
Cho

(10) Patent No.: US 8,922,293 B2
(45) Date of Patent: Dec. 30, 2014

(54) MICROSTRIP LINES WITH TUNABLE CHARACTERISTIC IMPEDANCE AND WAVELENGTH

(75) Inventor: Shu-Ying Cho, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 1519 days.

(21) Appl. No.: 12/135,659

(22) Filed: Jun. 9, 2008

(65) Prior Publication Data

US 2009/0302976 A1 Dec. 10, 2009

(51) Int. Cl.
*H01P 3/08* (2006.01)
*H05K 1/02* (2006.01)

(52) U.S. Cl.
CPC .............. *H01P 3/081* (2013.01); *H01P 3/082* (2013.01); *H05K 1/0225* (2013.01)
USPC ............................................. 333/33; 333/238

(58) Field of Classification Search
CPC ........ H01P 3/081; H01P 3/082; H05K 1/0225
USPC ................................................... 333/238, 33
See application file for complete search history.

(56) References Cited

U.S. PATENT DOCUMENTS

| | | | |
|---|---|---|---|
| 3,925,740 A | | 12/1975 | Steensma |
| 4,340,873 A | * | 7/1982 | Bastida ........................ 333/161 |
| 4,855,537 A | * | 8/1989 | Nakai et al. .................. 174/250 |
| 4,992,851 A | | 2/1991 | Platzoeder et al. |
| 5,313,175 A | | 5/1994 | Bahl et al. |
| 5,753,968 A | | 5/1998 | Bahl et al. |
| 5,841,333 A | | 11/1998 | Fishburn et al. |
| 6,060,383 A | | 5/2000 | Nogami et al. |
| 6,373,740 B1 | * | 4/2002 | Forbes et al. .................. 365/51 |
| 6,465,367 B1 | | 10/2002 | Tsai |
| 6,624,729 B2 | * | 9/2003 | Wright et al. ................. 333/238 |
| 6,950,590 B2 | | 9/2005 | Cheung et al. |
| 7,081,648 B2 | | 7/2006 | Tsai |
| 7,242,272 B2 | | 7/2007 | Ham et al. |
| 2003/0206077 A1 | | 11/2003 | du Toit et al. |
| 2004/0017270 A1 | | 1/2004 | Nagra et al. |
| 2005/0040915 A1 | | 2/2005 | Ryu et al. |
| 2005/0083152 A1 | * | 4/2005 | Hsu et al. ...................... 333/238 |
| 2006/0091982 A1 | | 5/2006 | Berg |
| 2006/0141979 A1 | | 6/2006 | Liu et al. |
| 2007/0241844 A1 | | 10/2007 | Kim et al. |
| 2009/0195327 A1 | | 8/2009 | Cho et al. |
| 2010/0141354 A1 | | 6/2010 | Cho |
| 2010/0214041 A1 | | 8/2010 | Cho |

OTHER PUBLICATIONS

Pozar, David M., "Microwave Engineering," 1990, 3 pages, Addison-Wesley, Reading, Massachusetts.

\* cited by examiner

*Primary Examiner* — Benny Lee
(74) *Attorney, Agent, or Firm* — Slater & Matsil, L.L.P.

(57) ABSTRACT

A microstrip line structure includes a conductive ground plane having a strip opening encircled by the ground plane. The strip opening extends from a top surface to a bottom surface of the ground plane. The microstrip line structure further includes a dielectric strip filling the strip opening; a dielectric layer over and contacting the ground plane; and a signal line over the dielectric layer, wherein the signal line has a portion directly above a portion of the dielectric strip, and wherein the signal line and the dielectric strip are non-parallel.

18 Claims, 4 Drawing Sheets

MICROSTRIP LINES WITH TUNABLE CHARACTERISTIC IMPEDANCE AND WAVELENGTH

TECHNICAL FIELD

This invention relates generally to microstrip line structures, and more particularly to microstrip line structures having tunable characteristic impedances and tunable characteristic wavelengths.

BACKGROUND

Transmission lines are important elements in microwave circuit applications. These devices provide the interconnection between active and passive devices of microwave circuits, and are utilized as impedance matching elements as well. A microstrip line is a type of transmission line widely utilized in monolithic microwave integrated circuit (MMIC) applications.

Microstrip lines have a number of advantages when utilized in MMIC applications. First of all, since microstrip lines are formed of conductive planes disposed on substrates, these devices are readily adaptable to the manufacturing process of the integrated circuits. Accordingly, microstrip lines may be integrated on a same substrate with commonly used integrated circuits such as complementary metal-oxide-semiconductor (CMOS) circuits.

FIG. 1 illustrates a conventional microstrip line 2 disposed over substrate 4 having a length L1 and a width W1. Microstrip line 2 includes signal line 6, ground plane 8, which is a solid metal plane, and dielectric layer(s) 10 separating signal line 6 from ground plane 8. Ground plane 8 has the advantageous feature of providing decoupling between signal line 6 and substrate 4, and hence the substrate-induced losses are reduced. However, the formation of ground plane 8 also incurs drawbacks. As the scaling of backend processes continues to trend downward, the vertical distance H between signal line 6 and ground plane 8 becomes significantly smaller, and hence requiring signal line 6 to be increasingly narrower in order to achieve the desirable characteristic impedance. Consequently, ohmic losses in microstrip lines become increasingly more significant, and demand better impedance matching between microstrip line 2 and network devices. Further, limited by the vertical distance H between signal line 6 and ground plane 8, which distance has little room for tuning, ground plane 8 itself becomes a barrier for tuning the characteristic impedance of microstrip line 2.

In addition, microstrip lines typically occupy great chip area. For example, the electromagnetic wavelength in $SiO_2$ dielectric material is about 3000 μm at 50 GHz. Accordingly, microstrip line 2, with the requirement that its length L1 needs to be at least a quarter of the wavelength, which is about 750 μm, in order to match network impedance, is area-consuming. With the increasing down-scaling of integrated circuits, the chip-area requirement of the microstrip lines becomes a bottleneck preventing the integration of microwave devices and the integrated circuits adopting CMOS devices.

Accordingly, what is needed in the art is a microstrip line that may incorporate the ground plane thereof to take advantage of the benefits associated with the reduced substrate losses while at the same time overcoming the deficiencies of the prior art.

SUMMARY OF THE INVENTION

In accordance with one aspect of the present invention, a microstrip line structure includes a conductive ground plane having a strip opening encircled by the ground plane. The strip opening extends from a top surface to a bottom surface of the ground plane. The microstrip line structure further includes a dielectric strip filling the strip opening; a dielectric layer over and contacting the ground plane; and a signal line over the dielectric layer. The signal line has a portion directly above a portion of the dielectric strip. The signal line and the dielectric strip are non-parallel.

In accordance with another aspect of the present invention, a microstrip line structure includes a substrate; and a ground plane over the substrate. The ground plane is conductive and includes two ground strip shields substantially parallel to each other, wherein the two ground strip shields are separated by a dielectric strip; and two ground conductors physically connected to opposite ends of the ground strip shields. The two ground conductors are substantially parallel to each other. The microstrip line structure further includes a dielectric layer over and contacting the ground plane; and a signal line over and contacting the dielectric layer. The signal line has a portion directly above a portion of each of the two ground strip shields. The signal line and the two ground conductors are substantially parallel.

In accordance with yet another aspect of the present invention, an integrated circuit device includes a semiconductor substrate; a metallization layer over the semiconductor substrate; and a ground plane in the metallization layer. The ground plane includes a plurality of ground strip shields substantially parallel to each other, wherein the plurality of ground strip shields are separated by a plurality of dielectric strips, and wherein each of the plurality of ground strip shields extends substantially from a top surface to a bottom surface of the ground plane; and two ground conductors physically connected to opposite ends of the plurality of ground strip shields, wherein the two ground conductors are substantially parallel to each other. The integrated circuit device further includes a plurality of inter-metal dielectric layers over the ground plane; and a signal line over the plurality of inter-metal dielectric layers. The two ground conductors are horizontally on opposite sides of the signal line. A lengthwise direction of the signal line is parallel to lengthwise directions of the two ground conductors.

The advantageous features of the present invention include adjustable characteristic impedances and adjustable characteristic wavelengths of microstrip lines. The chip area required by the microstrip line embodiments of the present invention is also reduced over conventional microstrip lines.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel microstrip lines having tunable characteristic impedances and tunable characteristic wavelengths are provided. The variations of the preferred embodiments are then discussed. Throughout the various views and illustrative embodiments of the present invention, like reference numbers are used to designate like elements.

Figure 2A:
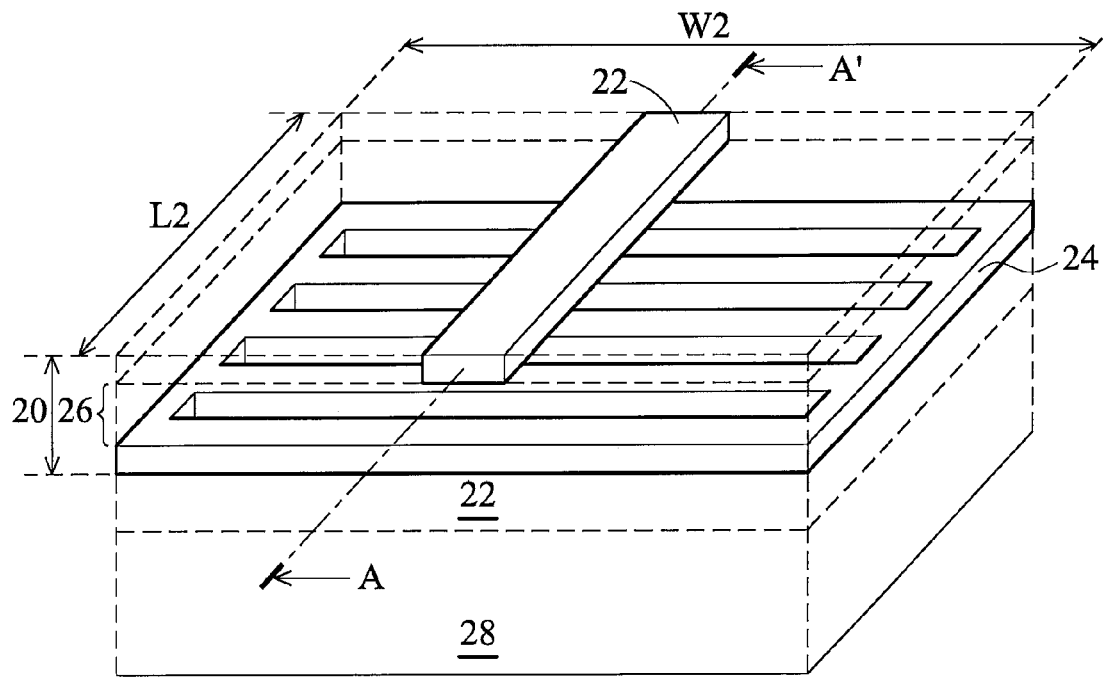
FIG. 2A illustrates a perspective view of an embodiment of the present invention, wherein a microstrip line includes a patterned ground plane.
Figure 2B:
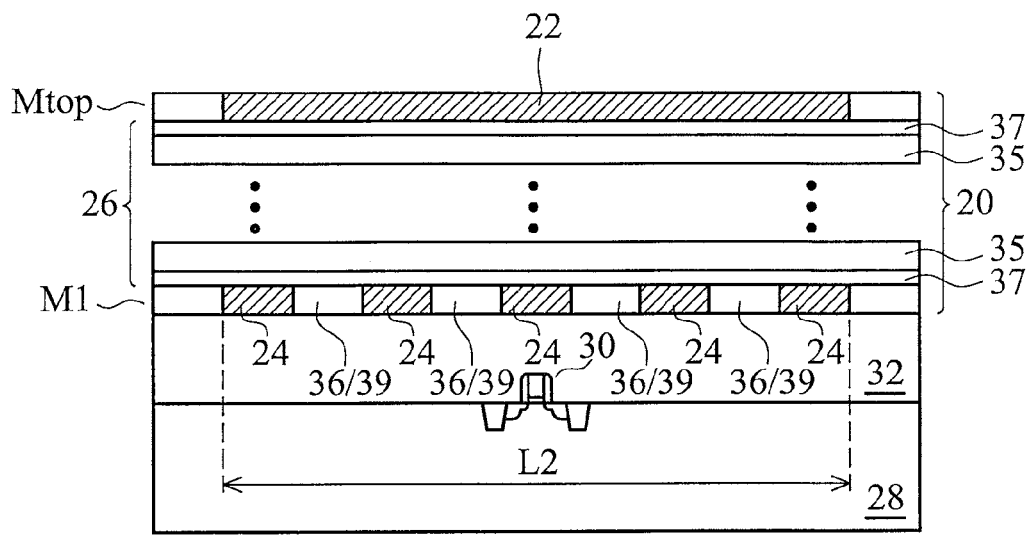
FIGS. 2B and 2C show a cross-sectional view and a top view, respectively, of the structure shown in FIG. 2A.
Figure 2C:
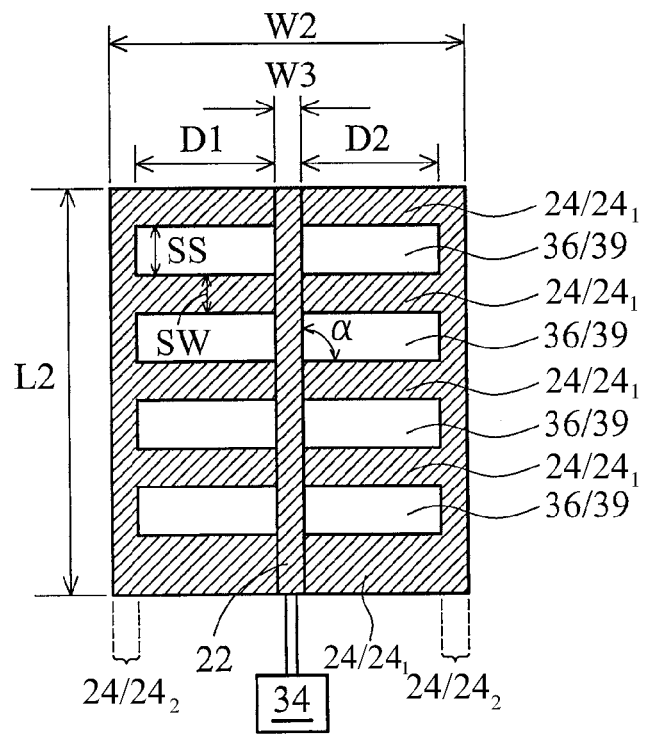

FIG. 2A illustrates a perspective view of an embodiment of the present invention. Microstrip line 20, which includes signal line 22, patterned ground plane 24, and dielectric layer(s) 26, is formed over substrate 28 (also see FIG. 5). In an embodiment, substrate 28 is a semiconductor substrate, and may include commonly used semiconductor materials such as silicon, germanium, and the like. The structure shown in FIG. 2A is a portion of a semiconductor chip, which may further include other regions having no microstrip line(s) formed thereon. As shown in FIG. 2B, integrated circuits 30, such as complementary metal-oxide-semiconductor (CMOS) devices, may be formed at the surface of substrate 28. The integrated circuits 30 are symbolized by a MOS device (refer to FIG. 2B). A microwave device 34 is connected to signal line 22, as schematically illustrated in FIG. 2C.

FIG. 2B illustrates a cross-sectional view of the structure shown in FIG. 2A, wherein the cross-sectional view is taken along a vertical plane crossing line A-A'. Ground plane 24, as the name suggests, is preferably grounded. In an embodiment, ground plane 24 is formed in a metallization layer, more preferably a lower metallization layer such as a first metallization layer, a second metallization layer, or the like. Accordingly, ground plane 24 may be formed over inter-layer dielectric (ILD) 32 (also see FIG. 5), wherein the integrated circuits 30 may be underlying ILD 32. Alternatively, ground plane 24 may be formed under ILD 32, and may be formed of doped polysilicon or metals. In this case, ground plane 24 may be formed simultaneously with the gates of the CMOS devices in integrated circuit 30.

Signal line 22, on the other hand, is formed in an upper metallization layer, such as the top metallization layer Mtop, which may be commonly referred to as M10. In other embodiments, signal line 22 is formed in a metallization layer underlying the top metallization layer, such as a metallization layer, which may be commonly referred to as M9, or the like. In yet other embodiments, signal line 22 may be formed over the top metallization layer Mtop, and may be formed of aluminum. Generally, signal line 22 and ground plane 24 may be formed in any metallization layers as long as a dielectric layer(s) separates signal line 22 and ground plane 24. The formation methods of signal line 22 and ground plane 24 include commonly known damascene processes, wherein signal line 22 and ground plane 24 are formed of copper or copper alloys. Signal line 22 has a smaller width W3 (FIG. 2C) than the width W2 of ground plane 24.

Referring to FIG. 2B, dielectric layer 26 may include the commonly known inter-metal dielectrics (IMD) 35, etch stop layers 37, which are between IMDs 35, and the like. Dielectric layer 26 may thus include low-k dielectric materials, for example, with dielectric constants lower than about 3.0, or even about 2.5 or lower. Preferably, no conductive features are formed in the region vertically between signal line 22 and ground plane 24, and directly over ground plane 24. In the case that signal line 22 is formed over the top metallization layer, dielectric layers 26 may further include a passivation layer(s).

FIG. 2C illustrates a top view of the structure shown in FIG. 2A. For simplicity, only signal line 22 and ground plane 24 are shown in FIG. 2C. Viewed from the top, ground plane 24 may have a rectangular parameter, with length L2 (in the lengthwise direction of signal line 22, which is the direction signals propagate, as also shown in FIGS. 2A and 2B) and width W2. Alternatively, ground plane 24 may have irregular shapes. At least one, and preferably more, openings 36 (also see FIG. 2B) are formed in ground plane 24. Openings 36 are preferably parallel to each other, and hence a plurality of strips (referred to ground strip shields hereinafter) $24_1$ are formed in ground plane 24. Openings 36 are filled with a dielectric material, for example, an IMD material, which may be a low-k dielectric material, and the resulting dielectric strips are referred to as dielectric strips 39 (also see FIG. 2B).

In the preferred embodiment, ground strip shields $24_1$ are perpendicular to the lengthwise direction of signal line 22, with the angle α being 90 degrees. Alternatively, angle α may have other non-zero values. Ground conductors $24_2$, which are end portions of the ground plane 24, interconnect to ground strip shields $24_1$. In the preferred embodiment, ground conductors $24_2$ are parallel to, or at least substantially parallel to, signal line 22.

To effectively shield substrate 28 (illustrated in FIG. 2B) from the signal carried in signal line 22, the total area of ground strip shields $24_1$ and the total area of dielectric strips 39 preferably have a ratio greater than about ⅓ and more preferably greater than about 1. The values of spacing SS and width SW of ground strip shields $24_1$ may affect the performance of the characteristic impedance and the characteristic wavelength of the resulting microstrip line 20 (illustrated in FIG. 2B), and the optimum values can be found through experiments.

The numbers of dielectric strips 39 and ground strip shields $24_1$ are preferably greater than about 2, and more preferably greater than about 4. In the preferred embodiment, ground strip shields $24_1$ are placed with a periodic pattern. For example, ground strip shields $24_1$ may be equally spaced. In alternative embodiments, the spacing SS between two neighboring ground strip shields $24_1$ may be different from other spacings SS. The spacings SS may also be arranged in an order from smaller to greater (for example, forming an arithmetic sequence or a geometric sequence), with each spacing SS being greater than a previous one.

Ground plane 24 may include more than one layer, each located in one of the metallization layers. In an embodiment of the present invention, the layers of the ground plane 24 are interconnected by periodically located via columns. In other embodiments, the via columns/via strips connecting different layers of the ground plane 24 form solid strips vertically overlapping, and possibly co-terminus with, the overlying and underlying ground strip shields $24_1$. Similarly, signal line 22 may also include more than one layer, each located in a metallization layer, with via columns or solid via strips connecting the layers of the signal line 22.

In the preferred embodiment, signal line 22 is located horizontally in the middle of ground conductors $24_2$, with horizontal distance D1 equal to horizontal distance D2, although distances D1 and D2 may be different from each other.

In a conventional microstrip line having a solid ground plane, the signal return path is in the solid ground plane, and at a position directly underlying the signal line. Advantageously, in the embodiments of the present invention, dielectric strips 39 (refer to FIG. 2C) cut the signal return path directly underlying signal line 22. Instead, the signal return paths are forced to ground conductors $24_2$, which are spaced far from signal line 22. Accordingly, the characteristic impedance and characteristic wavelength may be tuned by adjusting the distance between ground conductors $24_2$ and signal line 22, which adjustment may be implemented by adjusting the length W2 (hence distances D1 and D2) of ground plane 24. Advantageously, ground strip shields $24_1$ result in a slow-wave feature.

Figure 1:
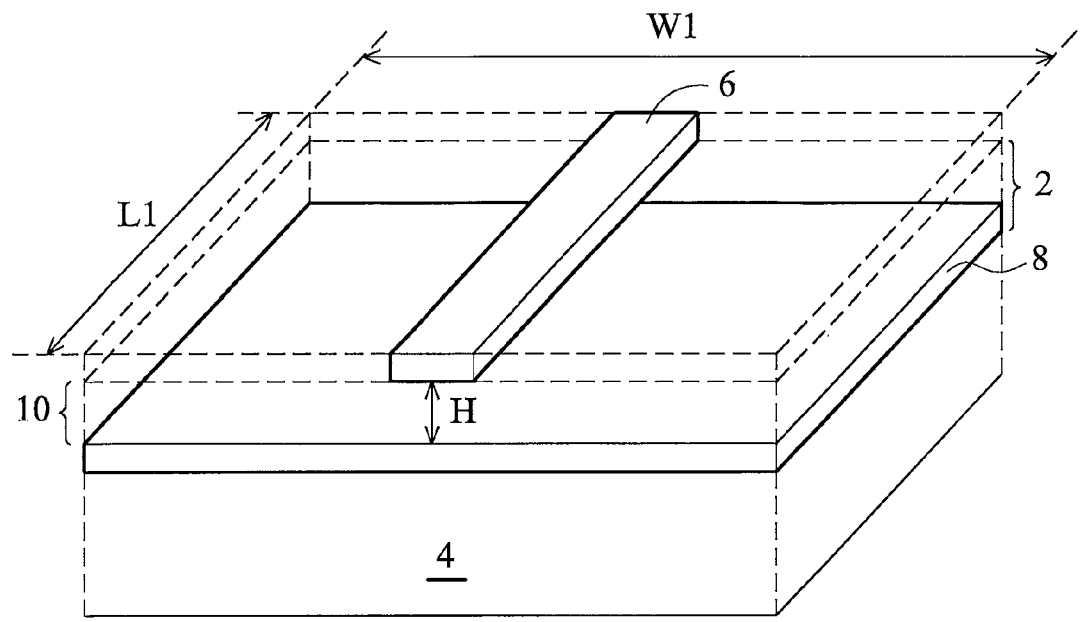
FIG. 1 illustrates a conventional microstrip line including a signal line and a solid ground plane, wherein the solid ground plane is between the signal line and an underlying substrate.
Figure 3:
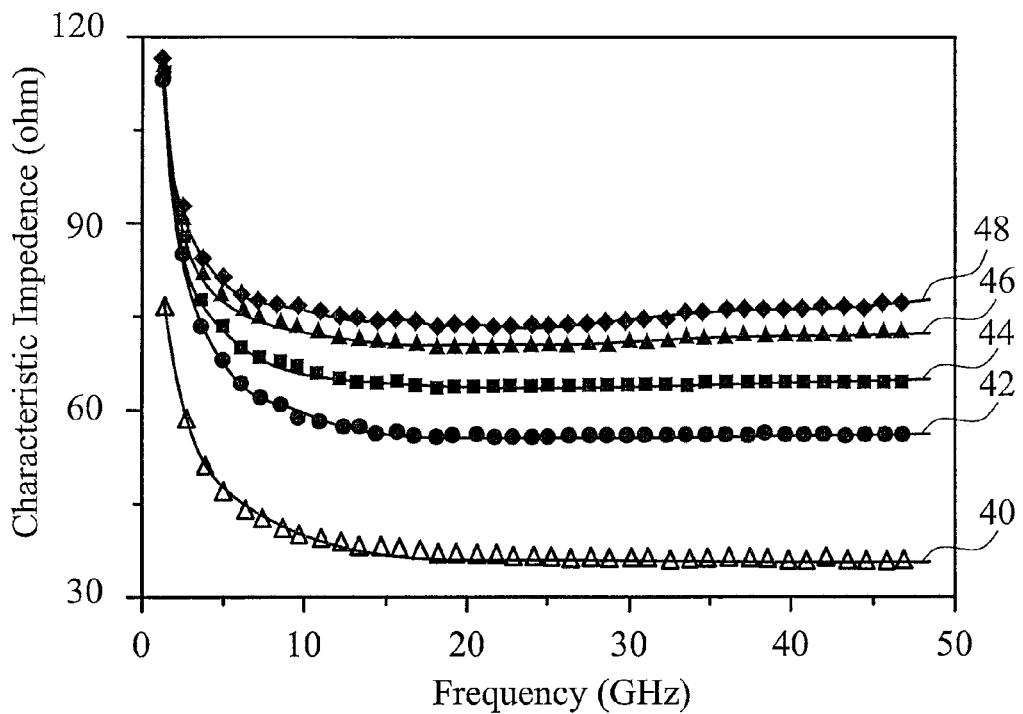
FIG. 3 illustrates characteristic impedances of microstrip lines as a function of frequencies.

FIG. 3 illustrates the characteristic impedances of the microstrip lines as a function of frequencies. Line 40 is obtained from a sample microstrip line having a solid ground plane (refer to FIG. 1), wherein the width W1 of the solid ground plane is 48 μm. Lines 42, 44, 46, and 48 are obtained from microstrip line samples having the structure as shown in FIG. 2A, with widths W2 being 12 μm, 24 μm, 48 μm, and 66 μm, respectively. FIG. 3 reveals that at any microwave frequency (in GHz), the characteristic impedances (in Ohms) of the embodiments of the present invention increase with the increase in the width W2 of ground plane 24. Accordingly, the characteristic impedances of the microstrip lines having the patterned ground planes as shown in FIG. 2A may be tuned by adjusting the widths W2. Further, it is noted that the characteristic impedance of the sample represented by line 42, which has a width W2 of 12 μm, is significantly greater than the characteristic impedance of line 40, which has a width of 48 μm. This indicates that the embodiments of the present invention may provide significantly greater impedances while the respective microstrip lines occupy less chip area than conventional microstrip lines having solid ground plane.

Figure 4:
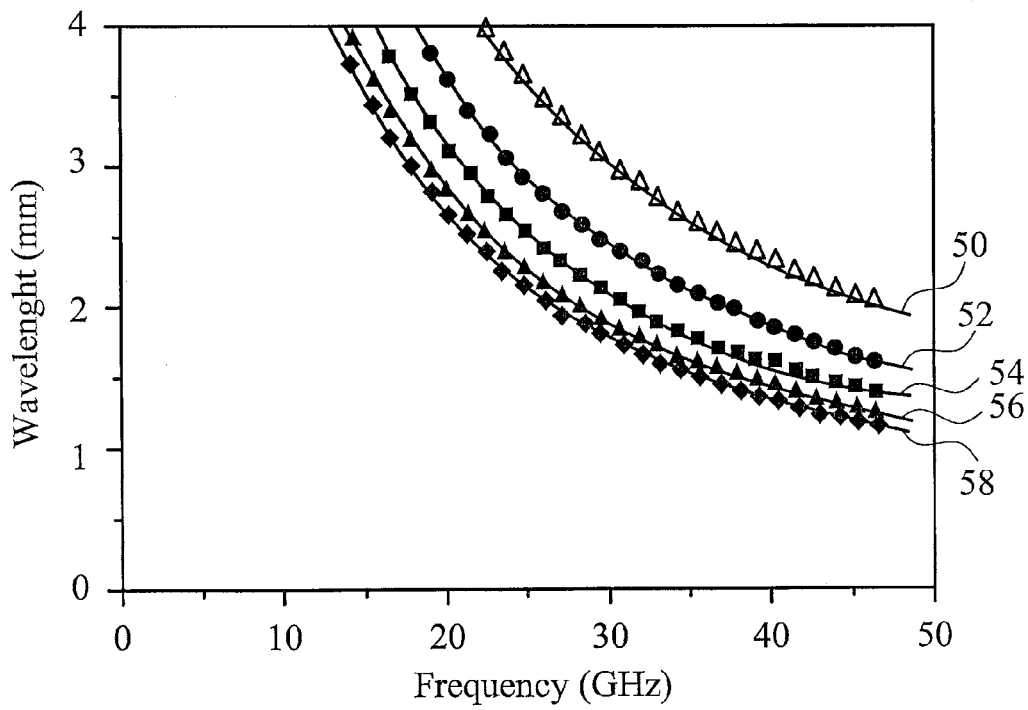
FIG. 4 illustrates characteristic wavelengths of microstrip lines as a function of frequencies.

FIG. 4 illustrates the characteristic wavelengths (in mm) of the microstrip lines as a function of frequencies (in GHz). Line 50 is obtained from a sample microstrip line having a solid ground plane (refer to FIG. 1), wherein the width W1 of the ground plane is 48 μm. Lines 52, 54, 56, and 58 are obtained from microstrip line samples having the structure as shown in FIG. 2A, with widths W2 being 12 μm, 24 μm, 48 μm, and 66 μm, respectively. FIG. 4 reveals that at any microwave frequency, the characteristic wavelength decreases with the increase in the width W2 of ground plane 24. Accordingly, the characteristic wavelengths of the microstrip lines may be tuned by adjusting the widths W2. Further, it is noted that the characteristic wavelength of the sample represented by line 52, which has a width W2 of 12 μm, is significantly less than the characteristic wavelength of line 50, which has a width of 48 μm. This indicates that the embodiments of the present invention may have smaller characteristic wavelengths than conventional microstrip lines, with the same or even smaller chip area being occupied. The microstrip lines of the present invention (when used as impedance matching devices) thus may have shorter length while still satisfying the quarter-wavelength requirement, which requires the lengths L2 of the microstrip lines to be no less than a quarter of the characteristic wavelength.

Figure 5:
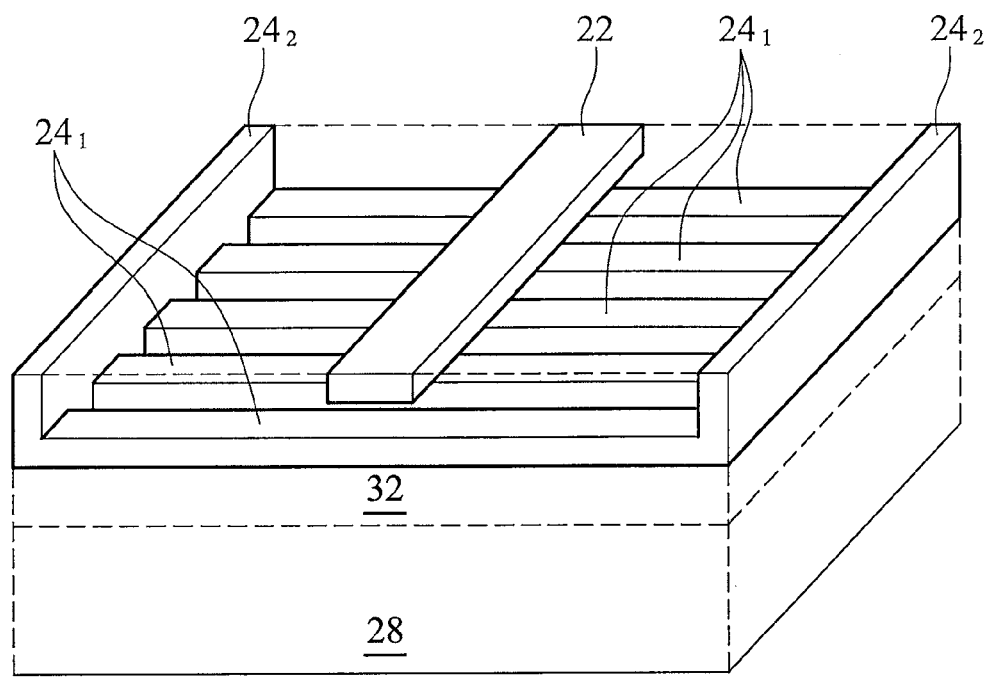
FIG. 5 illustrates an alternative embodiment of the present invention, wherein ground conductors of the ground plane extend above the top surfaces of ground strip shields.

FIG. 5 illustrates yet another embodiment of the present invention. In this embodiment, ground conductors $24_2$ extend upward beyond the metallization layer in which ground strip shields $24_1$ are located. In the illustrated embodiment as shown in FIG. 5, the top surfaces of ground conductors $24_2$ are leveled with the top surfaces of signal line 22. In other embodiments, the top surface of ground conductors $24_2$ may extend over, or lower than, the top surface of signal line 22.

Figure 6:
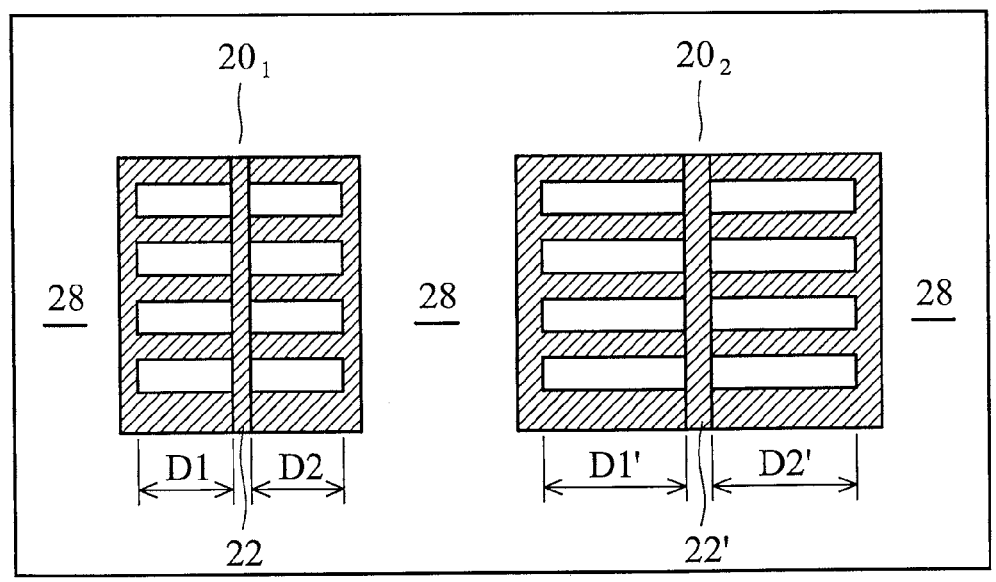
FIG. 6 illustrates two microstrip lines having different characteristic impedances and wavelengths.

It is realized that in one semiconductor chip, microstrip lines having different characteristic impedances and wavelengths may be needed. The embodiments of the present invention can easily satisfy such a requirement. In an embodiment of the present invention, as shown in FIG. 6, microstrip line $20_1$ and microstrip line $20_2$ are formed on a same substrate 28. Each of the microstrip line $20_1$ and microstrip line $20_2$ has a similar structure as shown in FIG. 2C. The horizontal distances D1/D2 between signal line 22 and ground conductors $24_2$ may be different from the horizontal distances D1'/D2' between signal line 22' and ground conductors $24_2$'. Accordingly, the characteristic impedance and the characteristic wavelength of microstrip line $20_1$ may be different from that of microstrip line $20_2$. Although not shown in FIG. 6, the vertical distances between signal lines 22 and 22' and the respective underlying ground planes 24 and 24' (refer to FIG. 2B) may also be different. In the case that microstrip line $20_1$ and $20_2$ are impedance matching devices, different characteristic impedances can be achieved by adopting different distances D1/D2 and D1'/D2'. If needed, more microstrip lines having different characteristic impedances and different characteristic wavelengths can be added.

The embodiments of the present invention have several advantageous features. Firstly, the characteristic impedance and characteristic wavelength may be tuned, and are not limited by the vertical distance between signal line and the underlying ground plane. Secondly, microstrip lines with greater characteristic impedances may be achieved without increasing the chip area of the microstrip lines. Thirdly, microstrip lines may have smaller characteristic wavelengths, resulting in shorter microstrip lines, which cause the further reduction in the chip area usage. Fourthly, the formation of the embodiments of the present invention do not need additional mask, and hence manufacturing cost is not increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A microstrip line structure comprising:
   a semiconductor substrate;
   a ground plane having a strip shape opening disposed within and encircled by the ground plane, wherein the strip shape opening extends from a top surface to a bottom surface of the ground plane, and wherein the ground plane is conductive, and is in a first metallization layer disposed over the semiconductor substrate;

a dielectric strip filling the strip shape opening;

a dielectric layer disposed over and contacting the ground plane; and a signal line disposed over the dielectric layer and in a second metallization layer over the semiconductor substrate, wherein the signal line has a portion directly above a portion of the dielectric strip, and wherein the signal line and the dielectric strip are oriented as to be non-parallel.

2. The microstrip line structure of claim 1 further comprising:

an additional strip shape opening disposed within and encircled by the ground plane and extending from the top surface to the bottom surface of the ground plane, wherein the additional strip shape opening has a portion directly under an additional portion of the signal line; and an additional dielectric strip filling the additional strip shape opening.

3. The microstrip line structure of claim 1, wherein the ground plane comprises a ground conductor substantially parallel to the signal line, wherein the ground conductor physically contacts an end of the dielectric strip.

4. The microstrip line structure of claim 1 further comprising an additional microstrip comprising:

an additional ground plane having an additional strip shape opening disposed within and encircled by the additional ground plane, wherein the additional strip shape opening extends from an additional top surface to an additional bottom surface of the additional ground plane, and wherein the additional ground plane is conductive;

an additional dielectric strip filling the additional strip shape opening;

an additional dielectric layer disposed over and contacting the additional ground plane; and an additional signal line disposed over the additional dielectric layer, wherein the additional signal line has a portion directly above a portion of the additional dielectric strip, and wherein the additional signal line and the additional dielectric strip are substantially perpendicular to each other.

5. The microstrip line structure of claim 1, wherein the dielectric layer comprises at least one inter-metal dielectric (IMD).

6. The microstrip line structure of claim 1, wherein the signal line is connected to a microwave device.

7. The microstrip line structure of claim 1, wherein the dielectric strip is substantially perpendicular to the signal line.

8. A microstrip line structure comprising:

a substrate;

a ground plane disposed over the substrate, wherein the ground plane is conductive and comprises:

two ground strip shields substantially parallel to each other, wherein the two ground strip shields are separated by a dielectric strip; and two ground conductors physically connected to opposite ends of the two ground strip shields, wherein the two ground conductors are substantially parallel to each other;

a dielectric layer disposed over and contacting the ground plane and comprising:

a plurality of inter-metal dielectrics (IMDs); and a plurality of etch stop layers separating the inter-metal dielectrics (IMDs); and a signal line disposed over and contacting the dielectric layer, wherein the signal line has a portion directly above a portion of each of the two ground strip shields, and wherein the signal line and the two ground conductors are substantially parallel.

9. The microstrip line structure of claim 8 further comprising a ground conductor extension disposed over, and electrically connected to, a top surface of one of the two ground conductors.

10. The microstrip line structure of claim 8, wherein the portion of the dielectric layer directly overlying the ground plane is free from conductive features.

11. The microstrip line structure of claim 8, wherein the signal line is in a top metallization layer of a plurality of metallization layers, and wherein the ground line is in a bottom metallization layer of the plurality of metallization layers.

12. The microstrip line structure of claim 8, wherein the ground plane further comprises additional ground strip shields substantially parallel to the two ground strip shields, wherein the additional ground strip shields are separated by additional dielectric strips, and wherein the two ground conductors are physically connected to opposite ends of the additional ground strip shields.

13. The microstrip line structure of claim 8 further comprising a microwave device connected to the signal line.

14. An integrated circuit device comprising:

a semiconductor substrate;

a metallization layer disposed over the semiconductor substrate;

a ground plane in the metallization layer, wherein the ground plane comprises:

a plurality of strip shape ground shields substantially parallel to each other, wherein the plurality of strip shape ground shields are separated by a plurality of dielectric strips, and wherein each of the plurality of strip shape ground shields extends substantially from a top surface to a bottom surface of the ground plane; and two ground conductors physically connected to opposite ends of the plurality of strip shape ground shields, wherein the two ground conductors are substantially parallel to each other;

a plurality of inter-metal dielectric layers disposed over the ground plane; and a signal line disposed over the plurality of inter-metal dielectric layers, wherein the two ground conductors are horizontally on opposite sides of the signal line, and wherein a lengthwise direction of the signal line is parallel to lengthwise directions of the two ground conductors.

15. The integrated circuit device of claim 14, wherein a plurality of metallization layers disposed over the semiconductor substrate and at least one of the signal line and the ground plane extends across more than one metallization layer.

16. The integrated circuit device of claim 14, wherein the two ground conductors have top surfaces higher than top surfaces of the plurality of strip shape ground shields.

17. The integrated circuit device of claim 14, wherein the two ground conductors are substantially equally spaced from the signal line.

18. The integrated circuit device of claim 14, wherein the plurality of strip shape ground shields are substantially equally spaced.

* * * * *